United States Patent
Khan et al.

(10) Patent No.: US 9,904,336 B1
(45) Date of Patent: Feb. 27, 2018

(54) DATA STORAGE SYSTEM WITH ARRAY OF FRONT FANS AND MOVING DOORS FOR AIRFLOW CONTROL

(71) Applicant: Intel Corporation, Santa Clara, CA (US)

(72) Inventors: Jawad B. Khan, Cornelius, OR (US); Randall K. Webb, Portland, OR (US); Michael D. Nelson, Mountain View, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/373,631

(22) Filed: Dec. 9, 2016

(51) Int. Cl.
G06F 1/20 (2006.01)

(52) U.S. Cl.
CPC .................... *G06F 1/206* (2013.01)

(58) Field of Classification Search
CPC ....................................................... G06F 1/206
See application file for complete search history.

(56) References Cited

U.S. PATENT DOCUMENTS

| | | | | |
|---|---|---|---|---|
| 6,826,456 B1* | 11/2004 | Irving | ....................... | G06F 1/20 361/695 |
| 7,051,215 B2* | 5/2006 | Zimmer | ............... | G06F 1/3203 713/300 |
| 7,200,008 B1* | 4/2007 | Bhugra | ................ | G11B 25/043 361/679.21 |
| 9,241,427 B1* | 1/2016 | Stevens | ................ | G11B 33/142 |
| 2006/0203446 A1* | 9/2006 | Radhakrishnan | ..... | F04D 25/166 361/695 |
| 2006/0256522 A1* | 11/2006 | Wei | ..................... | H05K 7/20581 361/695 |
| 2011/0194242 A1* | 8/2011 | Hu | .......................... | G06F 1/187 361/679.32 |
| 2011/0292589 A1* | 12/2011 | Yang | ....................... | G06F 1/183 361/679.32 |
| 2013/0141243 A1* | 6/2013 | Watts | ................... | H05K 7/1492 340/584 |
| 2015/0116930 A1* | 4/2015 | Yamaguchi | ........ | H05K 7/20736 361/679.48 |

* cited by examiner

*Primary Examiner* — Lisa Lea Edmonds
(74) *Attorney, Agent, or Firm* — Womble Bond Dickinson (US) LLP

(57) ABSTRACT

A data storage system is described with an array of front fans and moving doors for airflow control. In one example an enclosure is configured to mount in a rack. A horizontal plane board in the enclosure has memory connectors aligned in a row and external interfaces. Memory cards connect to a respective memory connector of the board. Removable fans at the front of the enclosure push air along the memory cards to the rear and doors at the front of the enclosure, each have an open position to accommodate a corresponding fan and a closed position to block airflow when the corresponding fan is removed.

20 Claims, 7 Drawing Sheets

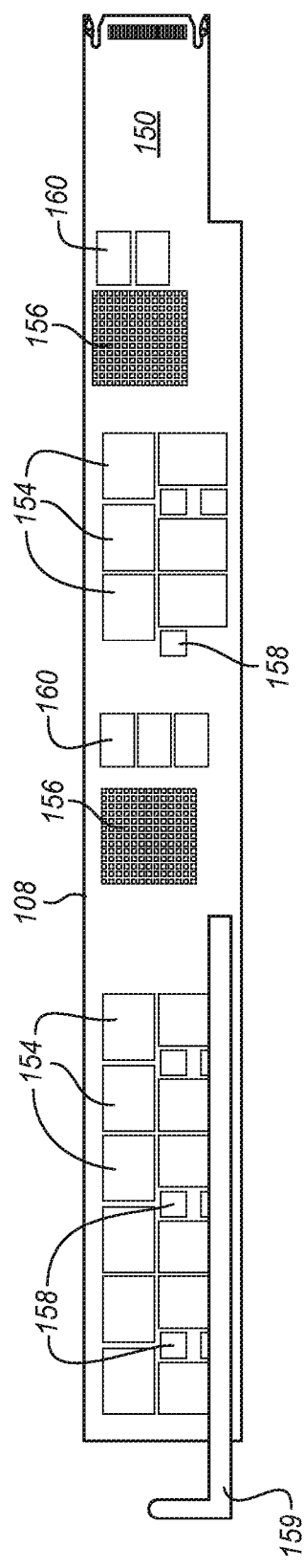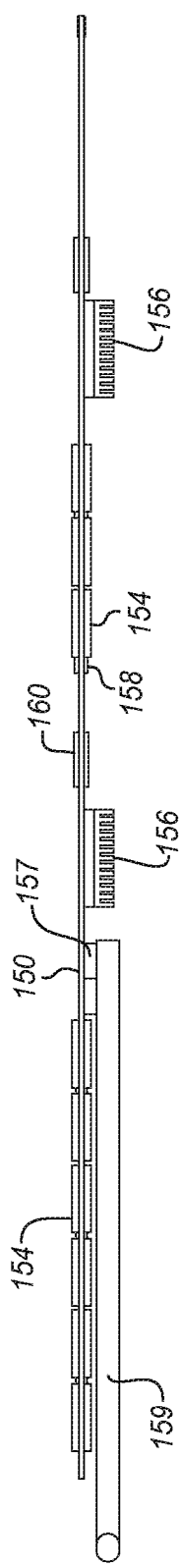
FIG. 8
FIG. 9

DATA STORAGE SYSTEM WITH ARRAY OF FRONT FANS AND MOVING DOORS FOR AIRFLOW CONTROL

FIELD

The present description pertains to the field of data storage systems and, in particular, to a system with a moving door to block airflow when a fan is removed.

BACKGROUND

High capacity, high speed, and low power memory is in demand for many different high powered computing systems, such as servers, entertainment distribution head ends for music and video distribution and broadcast, and super computers for scientific, prediction, and modeling systems. The leading approach to provide this memory is to mount a large number of spinning disk hard drives in a rack mounted chassis. The chassis has a backplane to connect to each hard drive and to connect the hard drives to other rack mounted chassis for computation or communication. The hard disk drives connect using SAS (Serial Attached SCSI (Small Computer System Interface)), SATA (Serial Advanced Technology Attachment), or PCIe (Peripheral Component Interface express) or other storage interfaces.

Flash arrays are constructed at high volume in a 2.5" hard disk drive form factor and in a M.2 module form factor. These form factors have been specifically developed for notebook computers and provide an amount of storage, speed, power consumption and cost that is best suited for notebook computers. An AFA (All Flash Array) could be built using these standard form factor SSDs (Solid State Drives). When off the shelf 2.5" SSDs are used for a large capacity solution and they are vertically mounted there is a minimum rack-mount chassis size of 2 U or 3 U due to the size of the drives, the mounting connectors and the need for airflow. M.2 SSDs have a lower capacity and so require many more devices and connectors.

In high speed memory arrays, the fans and the memory storage are most prone to failure. The fans are in constant use and the mechanical bearings and motors wear over time. The memory storage is in constant use and is stressed by high speed applications. Each memory cell has a limited number of read and write cycles in its lifetime and the other components of a memory may also wear or fail from temperature and usage stress.

To service a flash array, the chassis slides forward out of the rack partly or fully and a lid is removed to provide access to the memory cards or SSDs. A special cable solution is provided to allow the chassis to move forward without being disconnected at the rear. In some cases front mounted 2.5" SSDs are used to allow the drives to be serviced without moving the chassis. The front serviceable SSDs require middle mounted fans to allow access to the SSDs from the front.

BRIEF DESCRIPTION OF THE DRAWINGS

Embodiments are illustrated by way of example, and not by way of limitation, in the figures of the accompanying drawings in which like reference numerals refer to similar elements.

FIG. 8 is a side plan view of a memory card according to an embodiment.

FIG. 9 is a top plan view of the memory card of FIG. 8.

DETAILED DESCRIPTION

Cooling for a rack mountable memory array is improved using fans in the front of the enclosure. Serviceability is improved using front serviceable fans and storage modules. The system and structure described herein has excellent airflow characteristics for an All Flash Array (AFA) memory storage array. The structure is described in the context of a 19" long solid state drive (SSD), but may be applied to other types and configurations of front serviceable storage modules. Keeping the fans in the front of the enclosure provides easy serviceability of the fans and the storage modules. In addition, the chassis need not be put on rails to slide out in a rack. This avoids the need for expensive rails and for complex cable management in the back of the enclosure.

The described system and structure provides front serviceability of both memory drives and fans with excellent airflow characteristics. This is a highly dense, modular, redundant solution targeted at warm and cold storage markets. The system may include any of a variety of different features including fans mounted in front of front serviceable SSDs, garage doors to keep inside pressurized air from leaking out the front when an SSD is removed, a mechanism to pull the SSDs out of the chassis from the front, and an LED (Light Emitting Diode) indication of which SSD is to be removed. The doors are alternately referred to as "garage doors" or "doors." The term "garage" refers to the doors being hinged at the top and covering a bay, but these features are not necessary to obtain the benefits of the invention.

As described, dense memory storage boxes have high airflow, heat dissipation and storage density using a thin and long SSD form factor. This SSD will be referred to herein as a "Ruler Storage Module," "RSM," "ruler," "RSSD" or "memory card." Several RSMs may be used in a 19 inch wide rack-mount SSD system. However other memory configurations may be used instead. The memory cards may be placed in a single row multiple column arrangement, which helps guide the airflow and provides maximum surface area for the NAND media.

Figure 1:
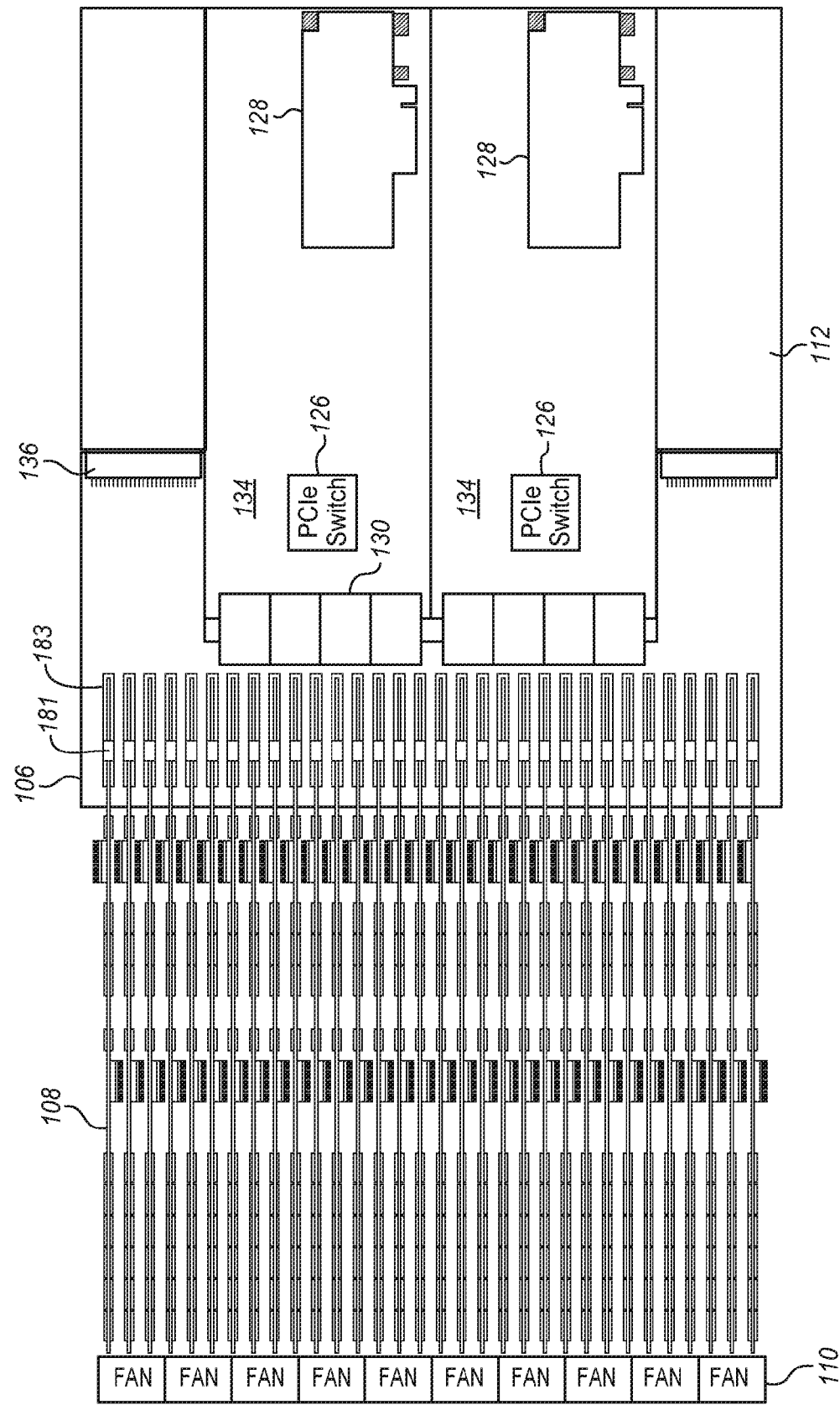
FIG. 1 is a top plan view of a memory system with a top cover removed according to an embodiment.

FIG. 1 is a top view diagram of an example memory system with a top cover removed. The doors described below are attached to the top cover and so are also removed. A high level architecture is shown of a variation of a 19" SSD 108. An array of fans 110 at the front of the enclosure blow air across an array of SSDs 108. In this example there are 10 fans to blow air across 30 RSSD memory cards. The precise number of fans may be adapted to suit the dimensions of the enclosure and particular type and configuration of fan and any other guides, shrouds, or other structures. The cards are placed vertically and aligned to be parallel to each other. The cards connect to a midplane 106 that has 30 connectors 183, one for each card. The connectors are at the rear end of the card. The connector may take a variety of different forms. The midplane is connected to a system module. The system module PCB is not visible in this view because it is covered by other components.

The midplane is coupled through a power connector 136 on left and right sides of the midplane (top and bottom as shown) to a left and right side power supply 112. These power supplies may be complementary or redundant and the midplane may be wired so that both power supplies are coupled to each RSSD.

The midplane base board is also coupled through an array of data connectors 130 to two switching modules 134. The left module serves the 16 RSSDs on the left and the right module serves the 16 RSSDs on the right. The RSSDs may also be cross-coupled so that each RSSD is coupled to both modules or connected in any of a variety of different patterns that include various types of redundancy.

The switching modules may contain any of a variety of different components, depending on the implementation. In this example, there is a PCIe switch 126 for each module and a network interface card (NIC) 128 for each module. The NICs allow for an Ethernet connection to external components. The Ethernet connection is converted to PCIe lanes for the RSSDs. Each RSSD may use one or more lanes of a PCIe interface depending on the speed and the amount of data for the particular implementation. The switching modules may also include system management sensors and controllers to regulate temperature, monitor wear and failures and report status. While switching modules are shown, other types of modules may be used including server computers that use the RSSDs as a memory resource. There are also one or more fan controller boards under the fans and coupled to the system management bus to control rotational speed and provide status. The system management bus may also send status for the fans and for the RSSDs to a display or alert on a corresponding fan.

Figure 2:
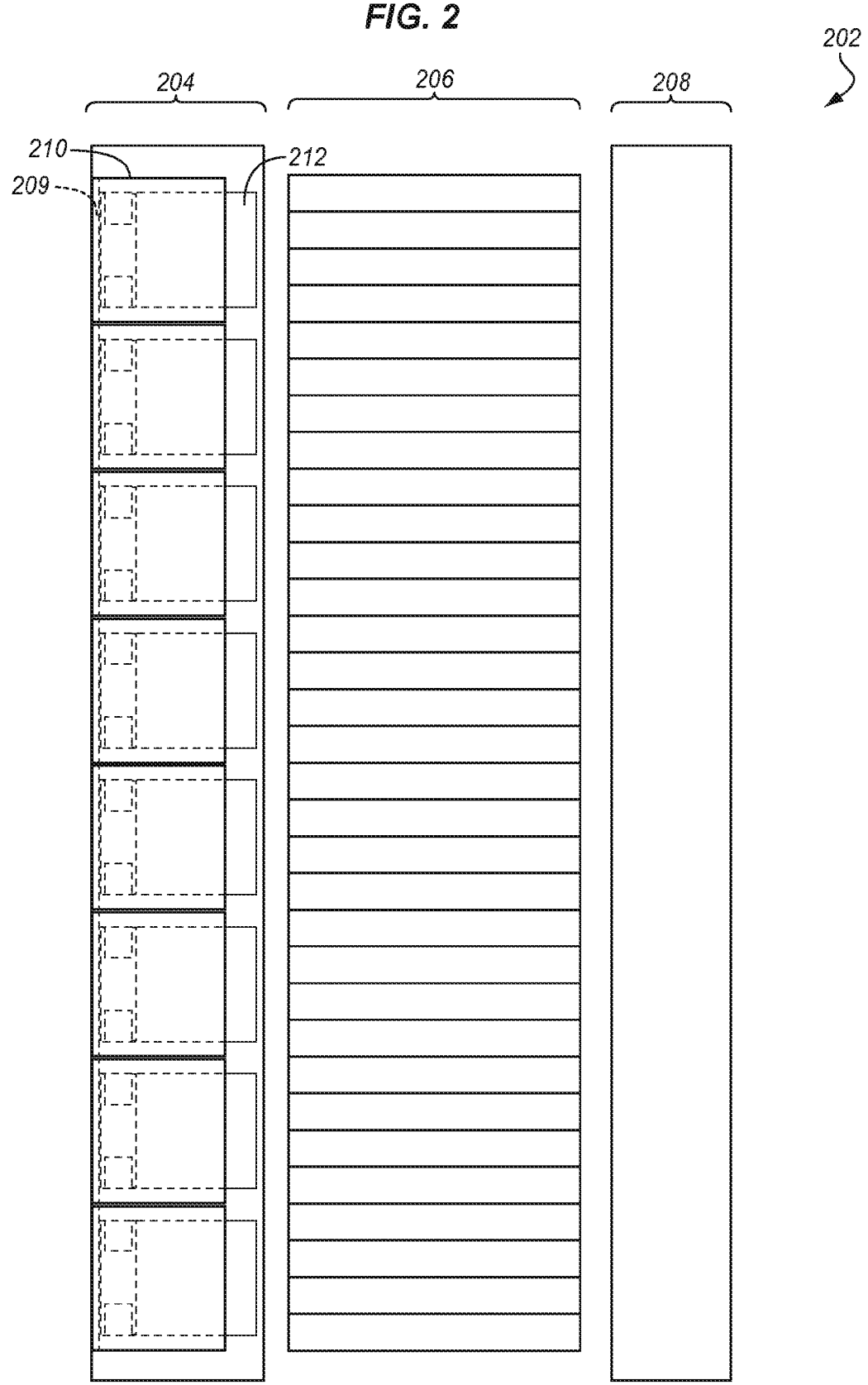
FIG. 2 is a top view diagram of a portion of a memory storage system enclosure according to an embodiment.

FIG. 2 is a top view diagram of a portion of a memory storage system enclosure. The chassis 202 may be seen as having three zones. There is a front fan zone 204. This zone is accessible from the front of the chassis, when the chassis is installed into a storage rack. Even when other enclosures are stacked above and below the chassis 202, the front is still accessible. In this example, eight fans 212 are shown. These fans are configured to draw air into the chassis from the front and push the air across and between the RSSDs. The air is then exhausted out the rear of the chassis. There may be additional fans in the middle or the rear of the chassis to help move the air from front to rear.

Figure 5:
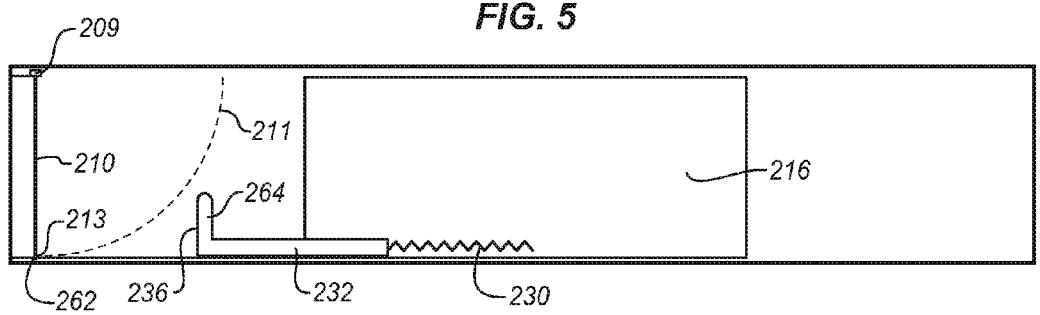
FIG. 5 is a side view diagram of a single bay inside a memory storage enclosure with a fan removed according to an embodiment.

There are also a corresponding set of eight garage doors 210. The doors are above the fans when the fans are in place. Each door has a front hinge 209 to allow it to rotate up as shown to make room for the fan or to rotate down as shown in FIG. 5 to close off the corresponding area of the fan zone when a fan has been removed. While eight separate fans and doors are shown, there may be more or less, depending on the particular dimensions of the chassis. With a standard 19" width, there may be many more fans.

Storage modules 212 are behind the fans in a storage zone 206. The storages modules may take any of a variety of different forms. In some embodiments, the storage modules are RSSD's as shown for example in FIG. 8 carrying memory chips, memory controller, and related components. Each RSSD has a rear edge connector to connect to the next zone for data and control and a front handle to allow it to be removed and replaced from the front of the chassis 202. As shown, with a corresponding fan removed, the RSSD may be accessed from the front of the chassis.

Behind the storage zone is a connection zone 208. This zone may include a middle row of fans, memory interfaces, processors, external interfaces to other chassis, power supplies, and rear fans. The particular configuration of the connection zone may be adapted to suit many different systems and uses.

Figure 3:
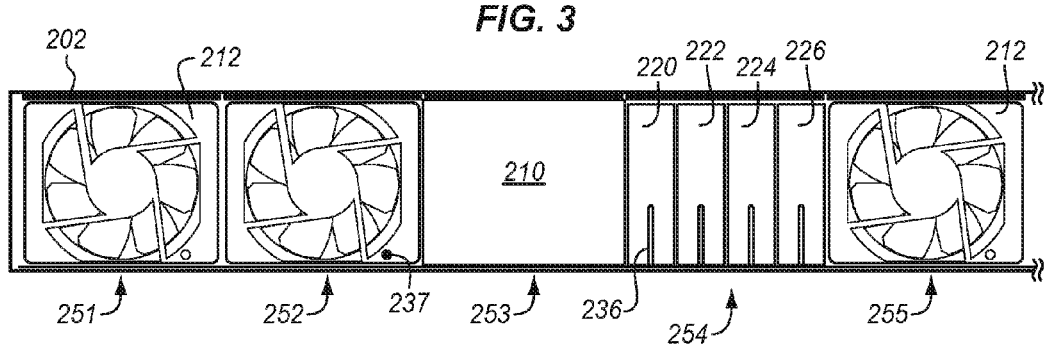
FIG. 3 is a front view diagram of a portion of the memory storage system enclosure of FIG. 2 according to an embodiment.
Figure 4:
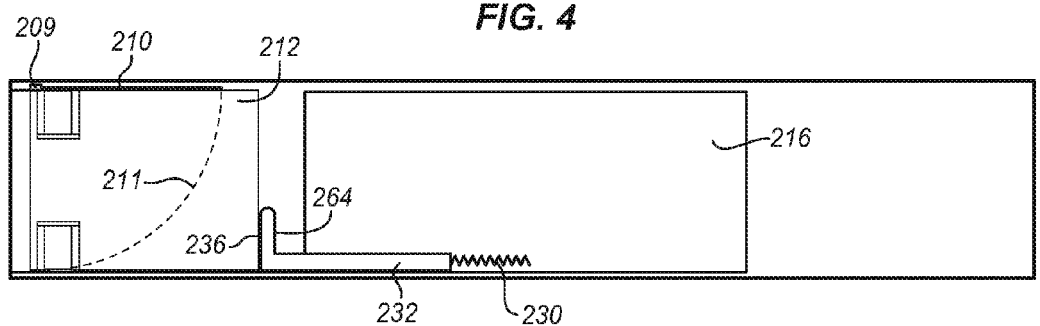
FIG. 4 is a side view diagram of a single bay inside the memory storage enclosure in an operational status according to an embodiment.

FIG. 3 is a front view diagram of a portion of the memory storage system enclosure. The chassis has an array of fans 212 across the front of the chassis. For illustration purposes each fan is shown with a different status. These different states correspond to various stages of an RSSD being removed. The first status shown in the left most fan bay 251 corresponds to normal operation. A fan 212 is installed and the garage door (not visible in this view) is open and rests above the fan as shown in FIG. 4. There are no status indicators because the system is operating normally. In some embodiments, there may be status indicators for normal operation for the fan, the RSSD, and any other components of the memory system.

A second stage is shown in the second bay 252 where an LED 237 associated with a failing RSSD is illuminated to indicate which fan must be removed to access the RSSD. This LED may be an LED on the failing RSSD, attached to the RSSD, or it may be an LED on the fan housing. In some embodiments, a management system monitors the status of each RSSD and then, upon detecting a failure or any other error status, sends a signal to the corresponding fan to illuminate an LED. In other embodiments, status indicators on the RSSDs are visible through the fan or fan housing.

A third stage is shown in the third bay 253, where the corresponding fan has been removed. As a result, the corresponding door 210 has dropped down from a horizontal to a vertical position as shown in FIG. 5. The door falls into a closed vertical position with the fan removed to block air loss through the front of chassis. The remaining fans pull air into the chassis to drive the air out the back after flowing across the memory and other components. Accordingly, the interior of the chassis is at a higher air pressure than the exterior. Without the door, some of the cooling air would escape out the front of the enclosure instead of flowing across the RSSD's to the back. This would reduce the effectiveness of the cooling for all of the other RSSD's.

A fourth stage is shown in the fourth bay 254 where the fan is removed and the door is held open by hand or by some prop or latch to allow any of four RSSDs 220, 222, 224, 226 to be accessed. Each RSSD has a visible status light 236. The status light may be provided in any of a variety of different ways including an LED soldered to the memory card or using a combined light pipe and handle as described below. In this example, the LED color on the handle indicates the RSSD status. Green may be used to mean proper operation. Yellow may be used to indicate an error status and red may be used to indicate a failed or failing status. Any other color code may be used instead. Alternatively, blinking or flashing may be used or different combinations of multiple lights or text or symbols may be used, depending on the implementation.

As shown, upon pushing open the corresponding door for the fourth bay 254, the failed RSSD 224 may easily and quickly be identified. The operator may then grab the RSSD by a handle, by hand, or using a tool and remove the defective RSSD. The RSSD may be repaired and reinstalled or replaced with another ready drive. In some embodiments, the light pipe may be used as a handle to remove the RSSD from chassis.

The fifth stage follows after replacing the defective memory and is similar to the first stage in which the portion of the memory system is operating properly. In the fifth bay 255 the fan has been re-installed or replaced after one or more of the RSSDs behind the fan have been serviced. The door is pushed up to a horizontal position and the fan is inserted below the door to hold the door up. With all of the RSSDs behind the fan in the fifth bay in good operating condition, there is no status light indication. In some embodiments, there may be a green status light to indicate a correct operational condition status.

FIG. 4 is a side view diagram of a single bay inside a chassis such as that of FIG. 3. There is a fan 212 at the front of the chassis, a memory card 216, such as an RSSD, immediately behind the fan and other components such as memory controllers, input/output interfaces, processors, power supplies, and other components (not shown) behind the memory card. The fan 212 holds a door 210 in a horizontal position above the fan. The hinge 209 allows the door to swing up and down so that its far end defines an arc as indicated by a dotted line 211.

When a fan 212 is inserted into the enclosure, the top back edge or right edge as shown in FIG. 4 pushes against the door 210. As the fan is pushed into the enclosure, the door is pushed back and up by the surface of the fan to reach the roughly horizontal position as shown. The fan is then snapped or fastened into place below the door so that the door stay open.

FIG. 5 is a side view diagram of the same bay with the fan removed. In this example, the memory card remains in place but the door 210 has pivoted about its hinge 209 which is near the front of the bay to allow the bottom of the door to swing down and forward in the arc 211 from a horizontal open and up position to a vertical closed and down position as shown. As shown, the hinge is a piano hinge but one or more other types of hinges may be used as desired. As mentioned, the door may operate on gravity, simply falling down into the closed position. The higher air pressure inside the chassis, when other fans are activated, applies a forward pressure on the door that will bias the door to the closed position.

In addition to biasing the door to the closed position by gravity and air pressure another bias source may be provided. As an example, the hinge 209 may include an integrated coil or leaf spring. Alternatively a spring may be mounted between the door and the enclosure in another location to urge the door into the closed position. In some embodiments, the hinge is on the side of the door so that the door moves back and to the side to open. For a side hinge, gravity will not move the door to either the open or closed position, so a spring or other bias source may be used to push the door closed when a fan is removed.

With the hinge near the front of the cabinet and the door swinging down and forward to close, the door is pushed back and up to open. With the door directly over the fan, a fan may be pushed against the door to open the door and pulled away from under the door to allow the door to close. The door may also be opened by hand or by any other means. The fan may have a back upper edge 260 that is configured to push against the door to push it up as the fan is pushed into the chassis. The fan may be attached with bendable tabs, with separate fasteners or in any other way.

Figure 6:
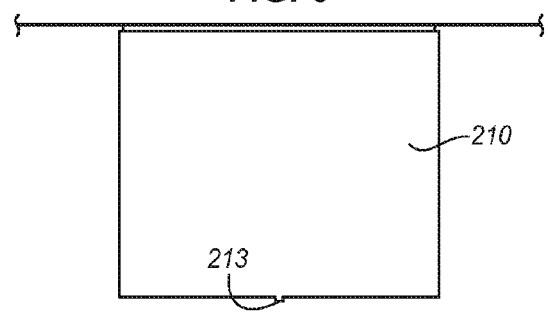
FIG. 6 is a front view of a bay door for use in the bay of FIG. 5 according to an embodiment.

FIG. 6 is a front view of the door 210 without the chassis. This view shows a tab 213 at the bottom of the door. The tab engages a slot 262, a ledge or a rail (see FIG. 5) at the front of the chassis. The slot prevents the tab from moving forward past the slot. The slot is placed to meet the tab when the door is in the vertical position. The slot may be formed in a controller board for the fan, in the metal housing, or in any other suitable structure. The slot and the tab stop further forward motion caused by the inner air pressure or any other force but it does not stop backward motion toward the RSSDs to open the door. The tab is used on the bottom of the door to engage the slot in the fan board to stop the door from swinging outwards. The door can still swing inwards with a push from a hand, a fan or any other object.

The tab is used on the bottom of the door to engage a slot in the fan board and thereby to stop the door from swinging outwards. While a single tab is shown, there may be multiple tabs to engage multiple slots. The number and position may be determined based on the internal air pressure and the material of the door. Alternatively, the tab may be made larger to distribute the force across more of the bottom of the door. A single tab may extend across all or most of the width of the door, depending on the materials used. If the slots are in a fan power controller board then the slots may be minimized to reduce the impact on signal routing space in the fan controller board. For a slot in the metal chassis, a larger slot may be easier to provide.

The tab on the bottom of the door allows the sides of each bay to be open. No vertical posts are required between each fan bay. However, in some embodiments, the tab is on one or both sides of the door and engages a vertical post of the enclosure to prevent the door from swinging beyond the vertical position of FIG. 4. In other embodiments, the hinge 209 is configured with stops to prevent rotation of the door past the vertical position of FIG. 4.

FIG. 4 also shows a light pipe 232 fastened to the memory card 216. The light pipe is coupled to a spring 230 to push it forward toward the front of the chassis away from the memory card. It also has a bend to create a handle 264 opposite the memory card. The handle has one end of the light pipe that allows the lights to be seen from the front of the enclosure behind the corresponding fan. The other end at the memory card is coupled to one or more LEDs to receive light and pass it to the front where it is visible to an operator.

The garage door 210, the fan 212, and the light pipe 232 on the RSSD 216 are all functionally connected. The door is pushed up by the fan, when the fan is inserted into its position in the chassis and holds the door up. When the fan is removed from the chassis the door falls to its closed position until the tab hits the slot. In this position the door blocks air loss through the front of the chassis because the other fans that are in place in the chassis are still operational.

The extended light pipe 232 shows the state of the RSSD. In FIG. 4, the light pipe is pushed against the spring 230 toward the RSSD. With the fan removed, the light pipe extends forward toward the closed door as shown in FIG. 5. The LED color or some other light feature indicates the status of the RSSD. In addition, the light pipe may be used as a handle to remove the RSSD from the chassis. The spring pushes the light pipe forward so that the status LEDs are easier to read and so that the handle 264 is easier to reach by an operator.

The light pipes are narrow enough to not restrict airflow, but strong enough to allow the RSSD to be removed from the chassis by pulling on the handle. In some embodiments, the light pipes are aligned with the RSSD's PCB and mounted on a heatsink assembly to minimize impact to the RSSD and to airflow.

Figure 7:
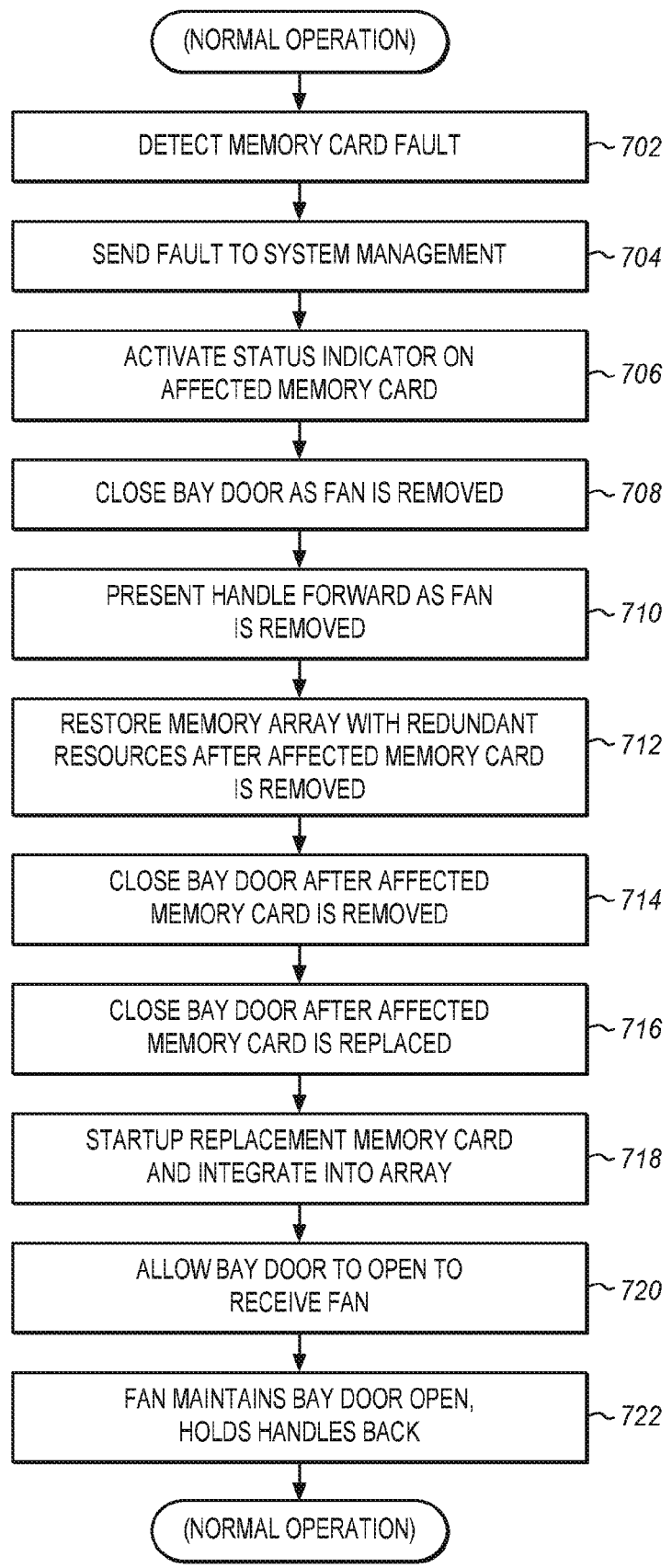
FIG. 7 is a process flow diagram of maintaining a memory system with front accessible fans according to an embodiment.

FIG. 7 is a process flow diagram of repairing memory array as described herein. The process starts with normal operation of the memory system. At 702 a memory card fault is detected by a memory controller and at 702, the fault is sent out on a system management bus of the memory system. At 706 the fault is sent to the memory card to active a warning on a status indicator of the memory card. This may be an LED on a light pipe at the front of the affected memory card or it may be some other visible status indicator. The fault may also be communicated to a control console, a remote management console or some other management device. An operator may observe the fault by observing the indicator on the memory card or may first be alerted by a management console to inspect the affected memory system.

An operator then acts to service the faulty memory card. At 708 the corresponding fan is removed and the corresponding door is released to close over the opening from which the fan was removed. At 710 the memory card handle extends forward from the affected memory card as the fan is removed. If there are multiple memory cards behind the fan, then all of the corresponding handles extend outward toward the front of the enclosure. The operator may then observe the status indicator to select the affected memory card. Alternatively, with no status indicator, the affected card may be indicated by position or another indicator by the management console. The operator pushes the door open and grabs the handle to pull out the memory card. After the card is withdrawn, the system relies on redundant stored data to continue to operate using redundant memory resources at 712. With the fan and the affected memory card removed the door is closed at 714. This maintains proper air flow for the other memory cards that remain in the enclosure.

This may end the service of the system. In other cases, the memory card will be replaced. The operator then uses the same memory card after repairs or a different functional memory card, pushes the door open and slides the new memory card into the appropriate slot. At 716 the door is closed after the replacement card is installed. At 718 it will be started, checked, and then integrated into the redundant memory array. To finish the replacement, the operator pushes the bay door open to allow the fan to be installed at 720. As described, the fan may be used to push open the door and make room for the fan. After the fan is installed, then at 722 it maintains the door in the open position and pushes all of the handles back toward the memory cards. The system has returned to normal operation. The fan may have electrical and mechanical connectors to the enclosure or a special fan controller board not shown here. The operator will also restore these connections.

FIG. 8 is a side plan view diagram of an RSSD or memory card 108 suitable for use with the memory system as described herein. The card has a printed circuit board (PCB) structure 150 with a connector 181 to the midplane at one end. Multiple memory chips 154, in this case eighteen chips, are mounted to one side of the PCB structure. There may be more or fewer depending on the application. Each memory chip generates heat with use and consumes power with read and write operations. The number of chips may be determined based on power, cost, heat, and capacity budgets. In some embodiments 3D NAND flash memory chips are used. However, other types of solid state memory may be used including PCM (Phase Change Memory), STTM (Spin Transfer Torque Memory), magnetic, polymer, and other types of memory.

The memory card further includes memory controllers 156 to control operations, manage cells, mapping, and read and write between the connector 152 and the memory chips 154. Fan out hubs 158 may be used to connect the memory controllers to the cells of each memory chip. Buffers 160 may also be used to support write, read, wear leveling, and move operations. A handle 159 that may include a light pipe is attached to a side of the PCB 150 for use in pulling the card out of the rear connector.

FIG. 9 is a top view of the memory card of FIG. 8 showing the same components. The card may be configured to support more memory chips on the other side or only one side may be used, depending on the budget for power, heat, and capacity. The memory card may have heat sinks and exposed chip package surfaces as shown, or may be covered with one or more larger heat sinks or heat spreaders as well as protective covers. The handle 159 is coupled to a sliding mechanism 157 that pushes the handle forward against a fan. This allows the handle to extend out to be more easily reached when a fan is removed.

The particular configuration and arrangement of the chips and the handle may be modified to suit requirements of different chips and to match up with wiring routing layers within the PCB. The buffers may be a part of the memory controllers or in addition to those in the memory controllers. There may be additional components (not shown) for system status and management. Sensors may be mounted to the RSSD to report conditions to the memory controller or through the connector to an external controller or both.

The RSSD allows a large amount of NAND flash memory to be packed into a small design. In this example with 1 TB of memory per NAND chip 154, 36 TB of memory may be carried on a single memory card. This amount may be reduced for lower cost, power, and heat and still use the same form factor. The Ruler Storage Module is shown with an end connector. This allows modules to be replaced without removing a top cover of the chassis even for a top serviceable enclosure. The memory modules may be removed and replaced simply by moving fans or access panels at the front. The handle is then accessible behind the fan or door to grab the module and remove it. Typical equipment racks allow the enclosure to slide forward to allow access without removing the enclosure from the rack but this is not required to service only the memory.

The Ruler Storage Module provides optimized airflow and a maximal surface area for storage media. This new storage module allows for a 1 U high, extremely dense SSD solution. This new storage module form factor does not hinder airflow in the system and yet is dense enough to provide a great advantage over existing form factors that were developed for other purposes, such as 2.5" notebook drives, AIC (Advanced Industrial Computer) memory, M.2 cards, and Gum-stick memory (typical USB stick style configurations). Some of these form factors cannot be used in a 1 U height enclosure in any arrangement.

The RSSDs provide quick and secure connections and may be configured to be hot-swappable in some systems. Using modular compute and connectivity blocks for the 19" SSD system described herein, one can easily, without system shut-down, swap out a compute module and insert a new compute module with varying compute horse power, depending upon the storage solution requirements, within the 19" SSD enclosure. For example, a low power compute module, such as an Intel® Atom® processor-based system may be used for storage targets that need mid-range compute capabilities, such as Simple Block Mode Storage, NVMe over Fabrics, iSCSI/SER, Fiber Channel, NAS (Network Attached Storage), NFS (Network File System), SMB3 (Server Message Block), Object store, distributed file system etc. A higher performance processor on the compute module may be used for Ceph nodes, Open Stack Object, Custom Storage Services and Key/Value Stores. For very high performance, the computing module may be in a different enclosure on the same or another rack and connected using PCIe switches or another memory interface.

In addition to providing interchangeable RSSDs, the same chassis and enclosure may allow for the system modules at the middle and rear of the enclosure to be interchangeable. This may allow for different connectivity modules to be used. The system may be upgraded to a different storage protocol (e.g. NVMe over Fabric RDMA (Remote Direct Memory Access), iSCSI (internet SCSI), NVMe, PCIe, or even Ethernet) without changing any of the RSSDs. This modularity also enables two modules to be used for redundancy and fail-over in some applications (e.g. traditional enterprise storage) and a single module for other applications (e.g. cloud computing).

Figure 10:
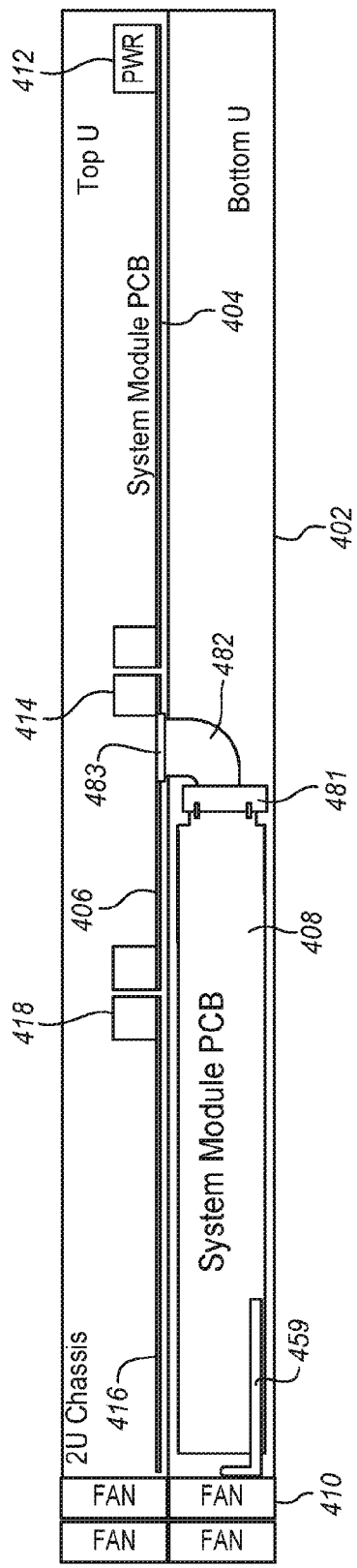
FIG. 10 is a cross-sectional side view diagram of an alternative memory system according to an embodiment.

FIG. 10 is a diagram of an alternative chassis enclosure for a 2 U (3.5" or 89 mm) rack height. In this enclosure, the same memory card configuration is used for 1 PetaByte plus of storage. The additional height allows for additional computing and switching components to be included with short fast connections to the memory. In this example, there is an array of memory cards 408 with handles 459 proximate the front of the enclosure coupled through connectors 481, 482, 483 to a midplane PCB 406 near the center of the enclosure. The midplane is coupled through connectors 414 to a system module PCB 404 at the rear of the enclosure. There is a front fan zone with an array of fans 410 to push air across the memory cards 408 and a rear power supply 412 fastened to or adjacent to the system module PCB 404 proximate the rear of the enclosure to pull air out of the chassis.

In contrast to the 1 U configuration, the system module may be on either the lower or upper side of the enclosure. The RSSDs have the same configuration and therefore use only one half of the 2 U chassis. In this example, the RSSDs are in the lower half of the enclosure but could alternatively be in the upper half. The system module is in the upper half opposite the RSSDs. Due to the PCB structure of the midplane and the system module, the PCBs are in the center of the enclosure and horizontal while the components on the PCBs extend vertically from the PCBs into the upper half of the enclosure. An additional system module (not shown) may also be added to the lower half of the enclosure at the rear of the enclosure.

The 2 U configuration also allows an additional system module PCB 216 to be added at the front of the enclosure above the RSSDs. As mentioned, the RSSDs may be in the upper half, in which case, the additional system module may be in the lower half instead. The additional system module may be used to provide computing power or additional switch fabric. As an example, the rear system module may be used as interface, switch fabric, and power supply, while the front system module is used as a computing zone with microprocessors and memory for low power or high power computing. Alternatively, the front system module or an additional rear module may be used for PCIe adapter cards for graphics rendering, audio or video processing, or other specialized tasks.

Figure 11:
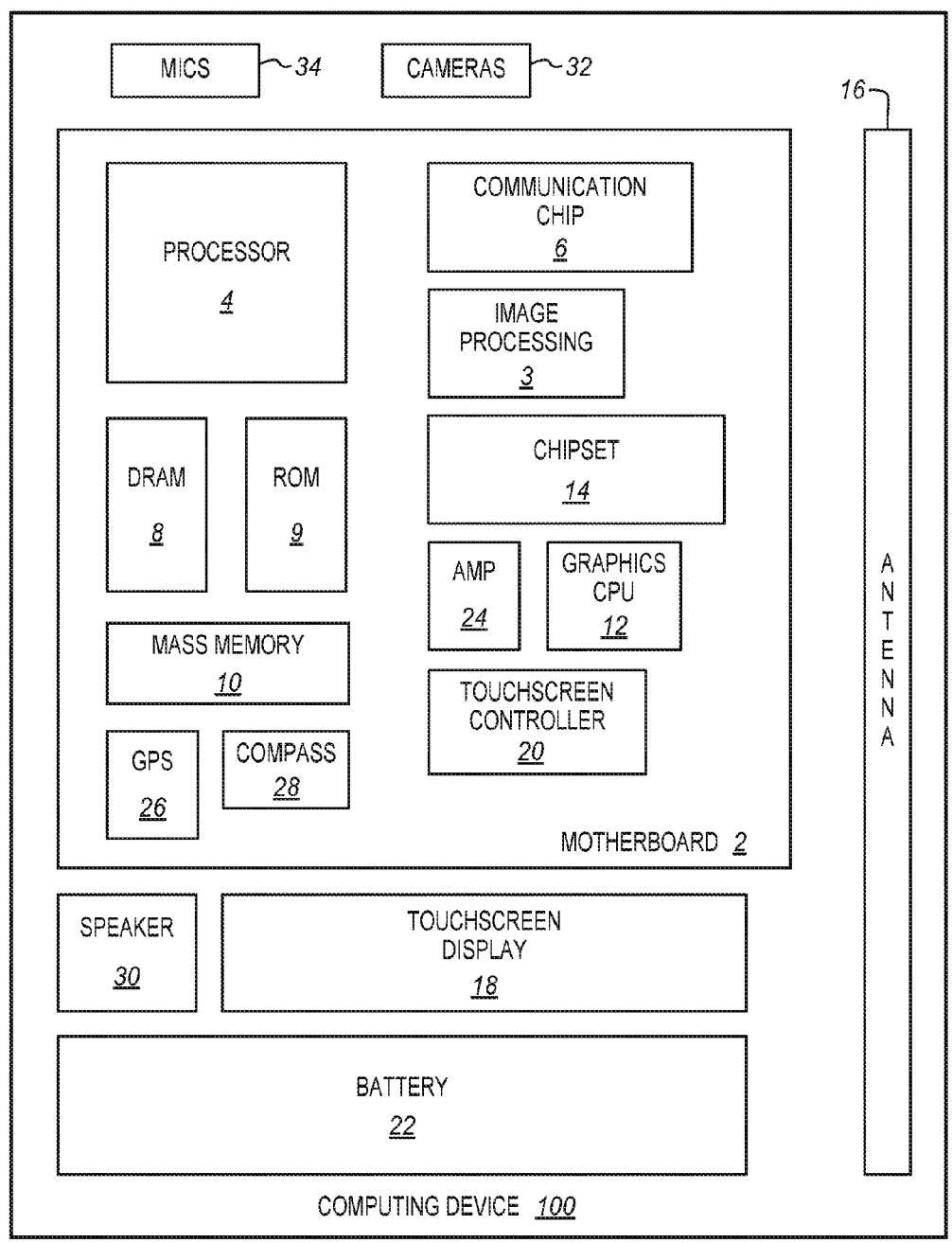
FIG. 11 is a block diagram of a computing device incorporating a memory system or capable of accessing a memory system according to an embodiment.

FIG. 11 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, a microphone array 34, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The computing system may be configured to be used as the system module. The computing system also reflects the entire rack-mount memory system where the mass memory is formed from multiple memory cards, as described. The memory system may have multiple iterations of the computing system within a single enclosure for each system module and also for the overall system.

In various implementations, the computing device 100 may be an entertainment front end unit or server, a music or video editing station or back end, a cloud services system, a database, or any other type of high performance or high density storage or computing system.

Embodiments may be include one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes in one example memory array chassis that includes an enclosure configured to mount in a rack, the enclosure having a front configured to receive airflow and a rear configured for cabling, a plane board in the enclosure having a plurality of memory connectors aligned in a row, a plurality of memory cards, each having an edge connector at one end of the memory card to connect to a respective memory connector of the board, each memory card extending parallel to each other memory, a plurality of removable fans at the front of the enclosure to push air along the memory cards to the rear, and a plurality of doors at the front of the enclosure, each door having an open position to accommodate a corresponding fan and a closed position to block airflow when the corresponding fan is removed.

In further embodiments each door is connected to the enclosure by a hinge to allow the door to move between the open position and the closed position.

In further embodiments the hinge is attached to the enclosure over the corresponding fan and wherein the door pivots about the hinge to move downward when the fan is removed.

In further embodiments the door blocks air loss through the former position of the removed fan when the door is in the closed position.

In further embodiments the corresponding fan holds the door in the open position.

In further embodiments the corresponding fan has a top edge configured to push the door to the open position when the fan is pushed into the front of the enclosure.

Further embodiments include a biasing means to push the door into the closed position when the corresponding fan is removed from the front of the enclosure.

In further embodiments the door further comprises a tab to prevent the door from moving toward the front of the enclosure when the door is in the closed position.

In further embodiments the tab is on a bottom edge of the door to engage a slot in a fan controller board below the corresponding fan.

In further embodiments the tab is on a side edge of the door to engage a vertical post in the enclosure.

Further embodiments include a handle attached to a memory card behind the corresponding fan, the handle configured to pull the memory card out of the front of the enclosure through the position of the corresponding fan after the corresponding fan is removed, and a biasing means to push the handle from a back position to a forward position when the fan is removed from the chassis.

In further embodiments the handle includes a status display to indicate a memory card fault.

Some embodiments pertain to a memory array chassis that includes an enclosure configured to mount in a rack, the enclosure having a front configured to receive airflow and a rear configured for cabling, a plane board in the enclosure having a plurality of memory connectors aligned in a row and a plurality of external interfaces, a plurality of memory cards, each having an edge connector at one end of the memory card to connect to a respective memory connector of the board, each memory card extending parallel to each other memory card, a plurality of interface connectors each to connect an edge connector to a respective board connector, a plurality of removable fans at the front of the enclosure to push air along the memory cards to the rear, a handle attached to a memory card behind the corresponding fan, the handle configured to pull the memory card out of the front of the enclosure through the position of the corresponding fan after the corresponding fan is removed, and a biasing means to push the handle from a back position to a forward position when the fan is removed from the chassis.

In further embodiments the handle includes a status display to indicate that the memory card is to be replaced.

In further embodiments the status display includes a light pipe of the handle optically coupled to a status indicator on the memory card.

In further embodiments the status indicator is an LED attached to the memory card and the light pipe extends from the LED to an end of the handle opposite the memory card.

In further embodiments the biasing means comprises a spring and wherein the fan, when installed, holds the handle in the back position.

Some embodiments pertain to an all flash memory array chassis that includes an enclosure configured to mount in a rack, the enclosure having a front configured to receive airflow and a rear configured for cabling, a horizontal plane board in the enclosure having a plurality of memory connectors to connect to a plurality of orthogonally mounted parallel memory cards and a plurality of external interfaces, a plurality of interface connectors each to connect an edge connector to a respective board connector, a plurality of removable fans at the front of the enclosure to push air along the memory cards to the rear, a plurality of doors at the front of the enclosure, each door having an open position to accommodate a corresponding fan and a closed position to block airflow when the corresponding fan is removed, a power supply proximate the rear of the enclosure to provide power to the memory cards through the memory card connectors and having a fan to pull air from the front of the enclosure between the memory cards and to push air out the rear of the enclosure, a switch fabric card coupled to the external interfaces of the horizontal plane board to couple the memory cards to external devices, and a cabling interface at the rear of the switch fabric coupled to the external connectors.

In further embodiments each door is connected to the enclosure by a hinge that is attached to the enclosure over the corresponding fan and wherein the door pivots about the hinge to move downward when the fan is removed to the closed position and to pivot upward to the open position.

In further embodiments the memory cards, the switch fabric, and the power supply are at a first level within the enclosure, the apparatus further comprising a compute module coupled to the memory cards and having an external cabling interface, wherein the computing device are at a second level within the enclosure, and the horizontal plane board is between the first level and the second level.

What is claimed is:

1. A memory array chassis comprising:
    an enclosure configured to mount in a rack, the enclosure having a front configured to receive airflow and a rear configured for cabling;
    a plane board in the enclosure having a plurality of memory connectors aligned in a row;
    a plurality of memory cards, each having an edge connector at one end of the memory card to connect to a respective memory connector of the plane board, each memory card extending parallel to each other memory card;
    a plurality of removable fans at the front of the enclosure to push air along the memory cards to the rear; and
    a plurality of doors at the front of the enclosure, each door having an open position to accommodate a corresponding fan and a closed position to block airflow when the corresponding fan is removed.

2. The memory array chassis of claim 1, wherein each door is connected to the enclosure by a hinge to allow the door to move between the open position and the closed position.

3. The memory array chassis of claim 2, wherein the hinge is attached to the enclosure over the corresponding fan and wherein the door pivots about the hinge to move downward when the fan is removed.

4. The memory array chassis of claim 1, wherein the door blocks air loss through the former position of the removed corresponding fan when the door is in the closed position.

5. The memory array chassis of claim 1, wherein the corresponding fan holds the door in the open position.

6. The memory array chassis of claim 1, wherein the corresponding fan has a top edge configured to push the door to the open position when the corresponding fan is pushed into the front of the enclosure.

7. The memory array chassis of claim 1, further comprising a biasing means to push the door into the closed position when the corresponding fan is removed from the front of the enclosure.

8. The memory array chassis of claim 1, wherein the door further comprises a tab to prevent the door from moving toward the front of the enclosure when the door is in the closed position.

9. The memory array chassis of claim 8, wherein the tab is on a bottom edge of the door to engage a slot in a fan controller board below the corresponding fan.

10. The memory array chassis of claim 8, wherein the tab is on a side edge of the door to engage a vertical post in the enclosure.

11. The memory array chassis of claim 1, further comprising:
    a handle attached to a memory card behind the corresponding fan, the handle configured to pull the memory card out of the front of the enclosure through the position of the corresponding fan after the corresponding fan is removed; and
    a biasing means to push the handle from a back position to a forward position when the corresponding fan is removed from the chassis.

12. The memory array chassis of claim 11, wherein the handle includes a status display to indicate a memory card fault.

13. A memory array chassis comprising:
    an enclosure configured to mount in a rack, the enclosure having a front configured to receive airflow and a rear configured for cabling,
    a plane board in the enclosure having a plurality of memory connectors aligned in a row and a plurality of external interfaces;
    a plurality of memory cards, each having an edge connector at one end of the memory card to connect to a respective memory connector of the plane board, each memory card extending parallel to each other memory card;
    a plurality of interface connectors each to connect an edge connector to a respective board connector;
    a plurality of removable fans at the front of the enclosure to push air along the memory cards to the rear;
    a handle attached to a memory card behind the corresponding fan, the handle configured to pull the memory card out of the front of the enclosure through the position of the corresponding fan after the corresponding fan is removed; and
    a biasing means to push the handle from a back position to a forward position when the corresponding fan is removed from the chassis.

14. The memory array chassis of claim 13, wherein the handle includes a status display to indicate that the memory card is to be replaced.

15. The memory array chassis of claim 14, wherein the status display includes a light pipe of the handle optically coupled to a status indicator on the memory card.

16. The memory array chassis of claim 15, wherein the status indicator is an LED attached to the memory card and the light pipe extends from the LED to an end of the handle opposite the memory card.

17. The memory array chassis of claim 13, wherein the biasing means comprises a spring and wherein the corresponding fan, when installed, holds the handle in the back position.

18. An all flash memory array chassis comprising;
    an enclosure configured to mount in a rack, the enclosure having a front configured to receive airflow and a rear configured for cabling;
    a horizontal plane board in the enclosure having a plurality of memory connectors to connect to a plurality of orthogonally mounted parallel memory cards and a plurality of external interfaces;
    a plurality of interface connectors each to connect an edge connector to a respective board connector;
    a plurality of removable fans at the front of the enclosure to push air along the memory cards to the rear;

a plurality of doors at the front of the enclosure, each door having an open position to accommodate a corresponding fan and a closed position to block airflow when the corresponding fan is removed;

a power supply proximate the rear of the enclosure to provide power to the memory cards through the memory connectors and having a fan to pull air from the front of the enclosure between the memory cards and to push air out the rear of the enclosure;

a switch fabric card coupled to the external interfaces of the horizontal plane board to couple the memory cards to external devices; and a cabling interface at the rear of the switch fabric card coupled to the external interfaces.

19. The all flash memory array chassis of claim 18, wherein each door is connected to the enclosure by a hinge that is attached to the enclosure over the corresponding fan and wherein the door pivots about the hinge to move downward when the fan is removed to the closed position and to pivot upward to the open position.

20. The all flash memory array chassis of claim 18, wherein the memory cards, the switch fabric card, and the power supply are at a first level within the enclosure, the apparatus further comprising a compute module coupled to the memory cards and having an external cabling interface, wherein the compute module is at a second level within the enclosure, and the horizontal plane board is between the first level and the second level.

* * * * *